US008592949B2

United States Patent
Roca I Cabarrocas et al.

(10) Patent No.: US 8,592,949 B2
(45) Date of Patent: Nov. 26, 2013

(54) METHOD OF TEXTURING THE SURFACE OF A SILICON SUBSTRATE, AND TEXTURED SILICON SUBSTRATE FOR A SOLAR CELL

(75) Inventors: Pere Roca I Cabarrocas, Villebon sur Yvette (FR); Mario Moreno, Palaiseau (FR); Dimitri Daineka, Palaiseau (FR)

(73) Assignees: Ecole Polytechnique, Palaiseau (FR); Centre National de la Recherche Scientifique, Paris (FR)

( * ) Notice: Subject to any disclaimer, the term of this patent is extended or adjusted under 35 U.S.C. 154(b) by 17 days.

(21) Appl. No.: 13/391,884

(22) PCT Filed: Aug. 23, 2010

(86) PCT No.: PCT/FR2010/051756
§ 371 (c)(1),
(2), (4) Date: Feb. 23, 2012

(87) PCT Pub. No.: WO2011/023894
PCT Pub. Date: Mar. 3, 2011

(65) Prior Publication Data
US 2012/0146194 A1   Jun. 14, 2012

(30) Foreign Application Priority Data
Aug. 24, 2009   (FR) ..................... 09 55767

(51) Int. Cl.
*H01L 29/34*   (2006.01)
(52) U.S. Cl.
USPC .............. 257/618; 438/719; 257/E29.108
(58) Field of Classification Search
None
See application file for complete search history.

(56) References Cited

U.S. PATENT DOCUMENTS 8,080,108 B2 *  12/2011  Nadaud et al. ............... 134/1.1

OTHER PUBLICATIONS

W.J.Lee et al. "High -Density Hollow Cathode Plasma Etching for Large Area Multicrystalline Silicon Solar Cells" Jan. 2, 2002 IEEE pp. 296-299.*
Lee et al., "High-Density Hollow Cathode Plasma Etching For Large Area Multicrystalline Silicon Solar Cells", Conference Record of the 29th IEEE Photovoltaic Specialists Conference, May 15, 2009, pp. 296-299, vol. Conf. 29, XP01066628.
Yoo et al., "RIE Texturing Optimization for Thin C-Si Solar Cells in SF6/02 Plasma", Journal of Physics D Applied Physics IOP Publishing, Jun. 21, 2008, pp. 125205 (7 pp.), vol. 41, No. 12, XP020133363.
Yoo J et al., "Black Surface Structures for Crystalline Silicon Solar Cells", Materials Science and Engineering B, Mar. 15, 2009, pp. 333-337, vol. 159-160, XP026109149.
International Search Report dated Mar. 5, 2012 from PCT/FR2010/051756.

* cited by examiner

*Primary Examiner* — Telly Green
*Assistant Examiner* — Damian A Hillman
(74) *Attorney, Agent, or Firm* — Young & Thompson

(57) ABSTRACT

The invention relates to a method for texturing the surface of a gaseous phase silicon substrate, and to a textured silicon substrate for a solar cell. The method includes at least a step a) of exposing the surface to an $SF^6/O^2$ radiofrequency plasma for a duration of 2 to 30 minutes in order to produce a silicon substrate having a textured surface having pyramidal structures, the $SF^6/O^2$ ratio being 2 to 10. During step a) the power density generated using the radiofrequency plasma is greater than or equal to 2500 mW/cm$^2$, and the $SF^6/O^2$ pressure in the reaction chamber is lower than or equal to 100 mTorrs, so as to produce a silicon substrate having a textured surface having inverted pyramidal structures.

10 Claims, 3 Drawing Sheets

METHOD OF TEXTURING THE SURFACE OF A SILICON SUBSTRATE, AND TEXTURED SILICON SUBSTRATE FOR A SOLAR CELL

The invention relates to a method of texturing the surface of a silicon substrate in the gas phase and a textured silicon substrate for a solar cell obtained using said method.

Such a textured silicon substrate is then used for the fabrication of heterojunctions for solar cells.

Texturing crystalline c-Si (100) silicon substrates is widely used for the fabrication of high efficiency silicon solar cells.

Texturing the surface of crystalline silicon substrates can reduce the reflectivity of light at their surface, enhance light trapping, increase the current produced and thus increase the efficiency of the solar cells.

Texturing methods consist in forming structures in the shape of pyramids on the substrate surface. Said pyramids may optionally be inverted.

The document by Martin A Green, Jianhua Zhao, Aihua Wang, and Stuart R. Wenham, IEEE Transactions on Electronic Devices, vol 46, No 10, pp 1940-1947 (1999) discloses a method of photolithography and wet etching that can produce a c-Si (100) silicon substrate with structures in the form of inverted pyramids on its surface.

That method can be used to obtain low reflectivities of the order of 8% and an efficiency of 24.7%.

However, that method is lengthy, difficult, and polluting since it requires the use of large quantities of deionized water and chemical solutions such as solutions of KOH or NaOH that have to be recycled.

In addition, texturing is not only carried out on a single face of the substrate, but also on its back face, resulting in a reduction in the quality of its passivation.

In order to overcome those problems, the document by J. Yoo, Kyunghae Kim, M. Thamilselvan, N. Lakshminarayan, Young Kuk Kim, Jaehyeong Lee, Kwon Jong Yoo, and Junsin Yi, Journal of Physics D: Applied Physics, pp 1-7 (2008) discloses a dry etching method using an $SF_6/O_2$ plasma for texturing the surface of a c-Si (100) crystalline silicon substrate. That method is carried out in a reactive ion etching (RIE) apparatus that can generate a radiofrequency plasma in the presence of gas.

A textured silicon substrate was obtained using an $SF_6/O_2$ pressure of 265 mTorr [millitorr], and by applying a radiofrequency plasma for 5 minutes to 20 minutes with an RF power of 100 W [watt].

That texturing method produces a multitude of needle-shaped structures 5 on the surface of the silicon substrate, as illustrated in FIG. 1. The reflectivities and efficiencies obtained are comparable with those obtained with wet methods.

However, such a surface, having peaks or needles, renders the textured substrate unusable for the fabrication of solar cells. In fact, it is then difficult, if not impossible, to deposit another layer of silicon in a homogeneous manner.

Thus, the aim of the invention is to provide a method of gas phase texturing that can produce a silicon substrate with very good reflectivity (less than 6%), with a textured surface with no needle-shaped structures, for use in the fabrication of solar cells.

To this end, the invention provides a method of gas phase texturing the surface of a silicon substrate, comprising at least the following step:

a) exposing said surface to an $SF_6/O_2$ radiofrequency plasma in a reaction chamber for a period in the range 2 minutes to 30 minutes, to produce a silicon substrate having a textured surface exhibiting pyramidal structures, the $SF_6/O_2$ ratio being in the range 2 to 10.

According to the invention:

during step a), the power density generated with the radiofrequency plasma is 2500 mW/cm² [milliwatt per square centimeter] or more, and the pressure of $SF_6/O_2$ in the reaction chamber is 100 mTorr or less, so as to produce a silicon substrate with a textured surface having inverted type pyramidal structures.

In various possible implementations, the present invention also provides the following features that may be considered in isolation or in any of their technically feasible combinations, each providing specific advantages:

the method of texturing the surface of a silicon substrate includes, before step a), a step a') of exposing said surface to an oxygen radiofrequency plasma for a period of up to 8 minutes;

during step a'), the power density generated with the radiofrequency plasma is in the range 500 mW/cm² to 4000 mW/cm², the pressure of oxygen in the reaction chamber being in the range 50 mTorr to 150 mTorr;

during steps a) and a'), the power density generated with the radiofrequency plasma is equal to 3000 mW/cm²;

during step a), the pressure of $SF_6/O_2$ in the reaction chamber is 100 mTorr, the $SF_6/O_2$ ratio is 3, and the plasma exposure period is 15 minutes;

during steps a) and/or a'), the power of the radiofrequency plasma is progressively increased;

the duration of step a') is 5 minutes; and steps a) and a') are carried out in a reactive ion etching apparatus.

The invention also provides a textured silicon substrate for a solar cell having a textured surface with inverted type pyramidal structures and resistivity in the range 0.5 Ω.cm [ohm-centimeter] to 30 Ω.cm.

According to the invention, the width of the inverted pyramidal structures is in the range 200 nm [nanometer] to 3 μm [micrometer], and the depth is in the range 200 nm to 1 μm.

In various possible embodiments, the present invention also provides the following characterizing feature that provides specific advantages:

the textured surface of the silicon substrate has structures in the form of large inverted pyramids and structures in the form of small inverted pyramids, the width of the structures in the form of large inverted pyramids being in the range 1 μm to 5 μm and the width of the structures in the form of small inverted pyramids being in the range 200 nm to 1 μm.

Thus, the invention provides a method of gas phase texturing that can be used to produce a silicon substrate with very good reflectivity (less than 6%) with a textured surface with no needle-shaped structures, for use in the fabrication of solar cells or optical sensors.

The surface roughness is compatible with depositing thin layers of doped silicon for the formation of a junction or heterojunction.

Locally, the roughness of the textured surface is less than that of the prior art.

It is possible to produce a homogeneous silicon deposit on such a textured surface. The deposit may be a homogeneous layer of a-Si:H that may be intrinsic or doped (p- or n-type) to form a heterojunction or a layer of epitaxial silicon to form a homojunction.

This simple texturing method can be used to reduce the steps in the fabrication process and thus to reduce solar cell fabrication time and costs and the impact on the environment. It also means that less material can be used.

The method can readily be integrated into a production line.

The reflectivity obtained with the method of the invention is less than that obtained with known wet techniques.

The reflectivity is low in the operational range of solar cells (400 nm to 1000 nm).

The invention is described below in more detail with reference to the accompanying drawings in which:

FIG. 1 shows a textured silicon substrate obtained with a prior art texturing method;

FIG. 2 diagrammatically represents four sections of a textured silicon substrate obtained with different RF powers, in accordance with various implementations of the invention;

In accordance with one implementation of the invention, the method of gas phase texturing the surface of a silicon substrate comprises a step a) of generating an $SF_6/O_2$ radiofrequency plasma in a reaction chamber for a period in the range 2 minutes to 30 minutes, leading to the formation of a silicon substrate having a textured surface with pyramidal structures. The $SF_6/O_2$ ratio is in the range 2 to 10 and the $SF_6/O_2$ pressure in the reaction chamber is in the range 50 mTorr to 150 mTorr.

The duration of step a) is preferably in the range 2 minutes to 30 minutes.

The silicon substrate may be mono-crystalline or multi-crystalline with grain sizes of the order of a millimeter. The silicon substrate may be a substrate of the c-Si (100) type, for example. It has resistivity in the range 0.5 Ω.cm to 30 Ω.cm. The silicon substrate may be n- or p-doped.

Step a) of generating an $SF_6/O_2$ radiofrequency plasma may be preceded by a step a') of exposing the surface of the substrate to an oxygen radiofrequency plasma for a period of up to 8 minutes.

The texturing method may function with or without an oxygen plasma. However, step a') can be used to improve the uniformity of the substrate texture.

Steps a) and a') are carried out in the same conventional reactive ion etching apparatus that can generate a radiofrequency plasma in the presence of gas. The frequency of the reactive ion etching apparatus is 13.56 MHz [megahertz].

During step a), the power of the radiofrequency plasma is more than 25 W, corresponding to a power density of 500 mW/cm$^2$, preferably 2500 mW/cm$^2$ or more.

The $SF_6/O_2$ pressure in the reaction chamber is 100 mTorr or less, in order to produce a silicon substrate with a textured surface having inverted type pyramidal structures.

During step a'), the power of the radiofrequency plasma is in the range 25 W, corresponding to a power density of 500 mW/cm$^2$, to 200 W, corresponding to a power density of 4000 mW/cm$^2$. The plasma generated during these steps is a low temperature plasma (200° C. or lower).

Preferably, during step a'), the oxygen radiofrequency plasma is generated for a period of 5 minutes, with a radiofrequency (RF) power of 150 W, i.e. a power density of 3000 mW/cm$^2$.

Next, during step a), as is preferable, the $SF_6/O_2$ radiofrequency plasma is generated for a period of 15 minutes, with an $SF_6/O_2$ pressure of 100 mTorr, and an $SF_6/O_2$ ratio of 3, corresponding to an $SF_6$ flow rate of 99 cm$^3$/s [cubic centimeter per second], and an $O_2$ flow rate of 33 cm$^3$/s. The power of the RF plasma is 150 W, i.e. a power density of 3000 mW/cm$^2$.

Figure 1:
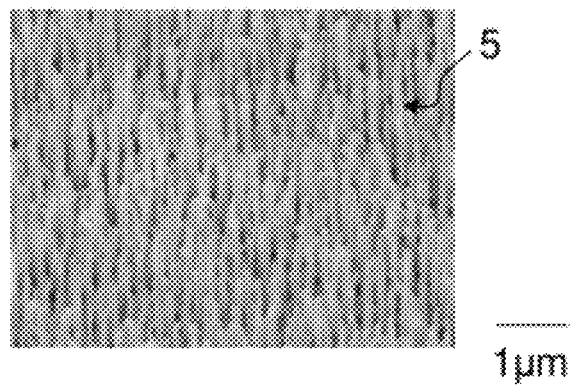
Figure 2:
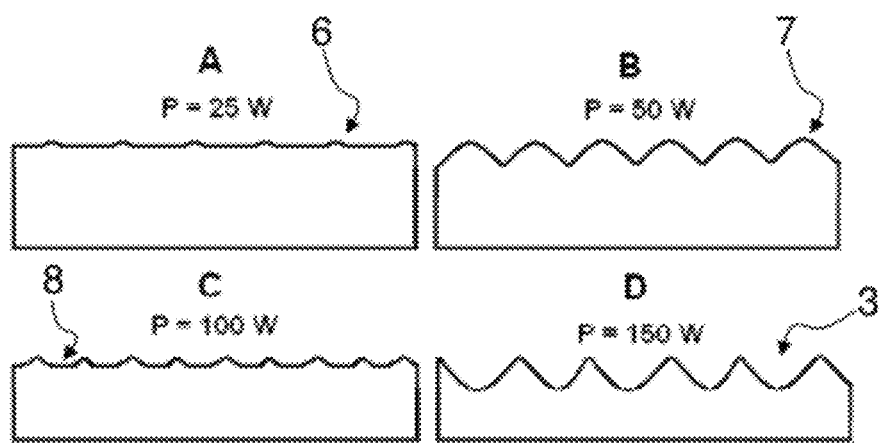
Figure 3:
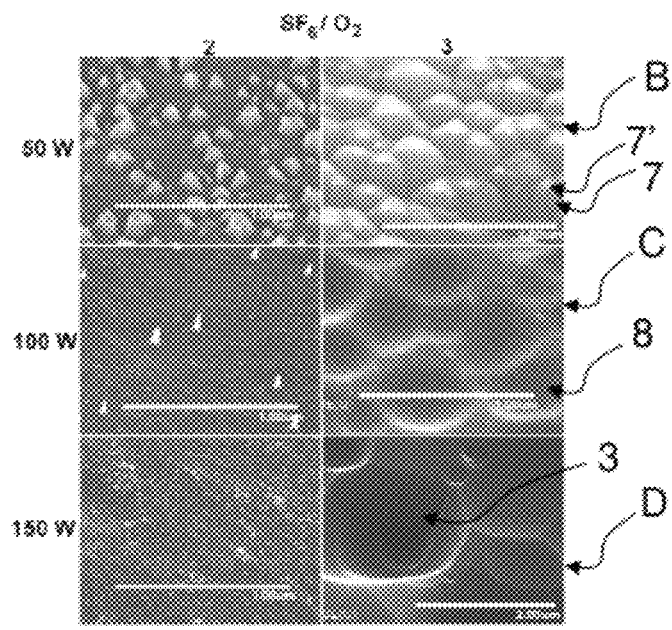
FIG. 3 shows photographs of textured silicon substrates obtained using a scanning electron microscope for different RF powers and different $SF_6/O_2$ ratios.
Figure 4:
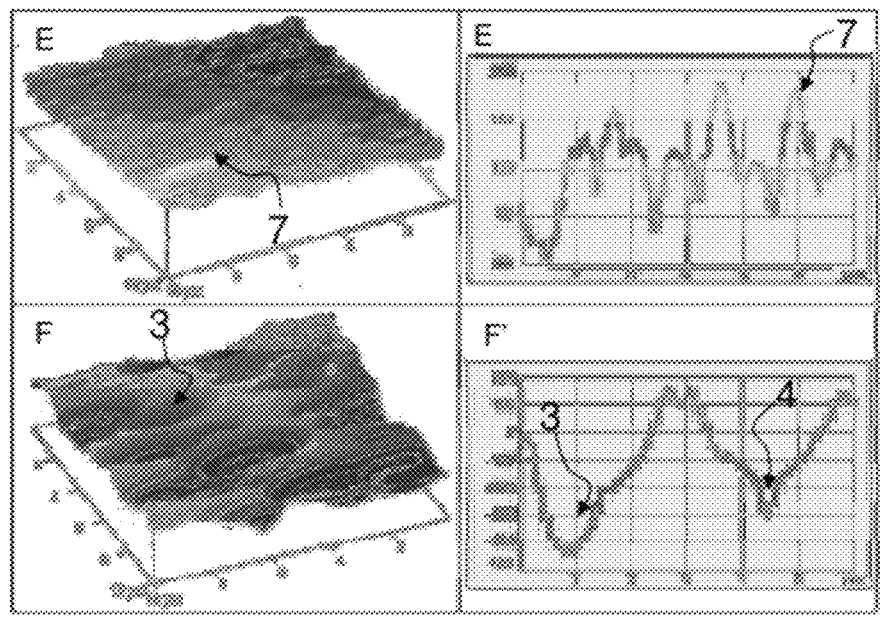
FIG. 4 shows images and surface profiles of textured silicon samples produced by AFM.

Under optimized conditions, a silicon substrate c-Si (100) is obtained with a textured surface comprising a multitude of inverted pyramids with a size distribution in the range 200 nm to 3 μm, as illustrated in FIGS. 2 to 4.

The addition of oxygen gas to the $SF_6$ gas plays an important role in the plasma.

On the surface of the substrate, two opposed effects occur in the $SF_6/O_2$ plasma: an etching process due to fluorine radicals that are very effective in etching the silicon, and a process of re-deposition due to residual radicals of $SiO_xF_y$, which produce a masking effect. These micro-masks increase texturing of the surface of the c-Si substrate.

The $SF_6/O_2$ ratio determines the density of the micro-masks and a ratio of 3 improves the density of the structures produced on the silicon wafers. Furthermore, the power of the RF plasma determines the shape of the structures produced. By varying the RF power and using an optimized gas ratio ($SF_6/O_2=3$), it is possible to produce very different structures (normal or inverted pyramids).

FIG. 3 shows photographs of textured silicon substrates obtained with a scanning electron microscope (SEM) for RF powers of 50 W, 100 W and 150 W, and $SF_6/O_2$ ratios of 2 and 3, and a pressure for the $SF_6/O_2$ mixture of 100 mTorr.

This FIG. 3 shows that the best texturing is obtained with an $SF_6/O_2$ ratio of 3 and an RF power of 150 W.

FIG. 2 diagrammatically represents four sections of textured silicon substrate obtained with different RF powers, namely a substrate A obtained at 25 W, a substrate B obtained at 50 W, a substrate C obtained at 100 W and a substrate D obtained at 150 W. The $SF_6/O_2$ ratio is 3.

For an RF plasma power of 25 W (substrate A), it is possible to observe a density of small textured dots 6 with sizes in the range 50 nm to 100 nm.

Increasing the RF power to 50 W (substrate B) results in a higher density of normal pyramids 7, with structures having sizes in the range 200 nm to 500 nm.

Increasing the RF power to 100 W brings about a spectacular change in the exterior texture (substrate C). The pyramids are replaced by structures in the form of pits 8, with a size distribution in the range 200 nm to 800 nm.

Finally, at 150 W (substrate D), a high density of inverted pyramids 3 is generated with a range of sizes in the range 200 nm to 3 μm. Small pyramids 4 are superimposed over large pyramids 3.

Figure 5:
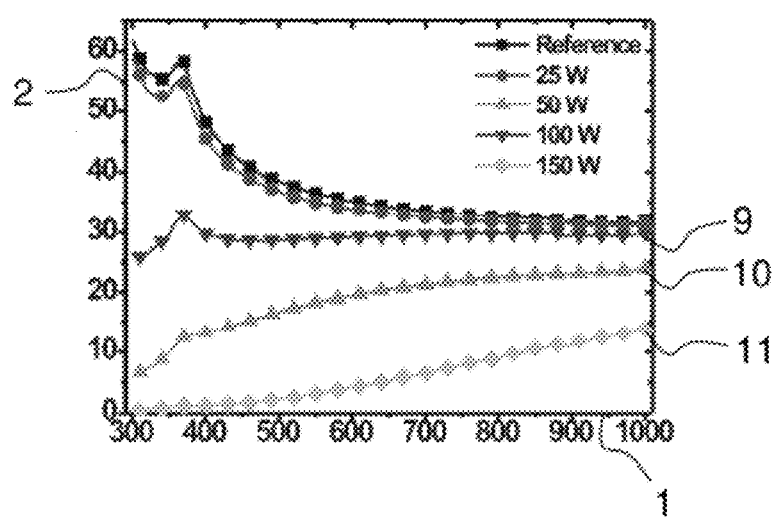
FIG. 5 shows reflectivity curves for silicon substrates textured at different RF powers.

FIG. 5 shows reflectivity curves for a textured c-Si substrate in the wavelength range 300 nm to 1000 nm.

The abscissa 1 represents the wavelength in nm and the ordinate 2 represents the reflectivity as a %.

For substrate B of FIG. 2 (RF power 50 W), the reflectivity curve 10 of FIG. 5 shows that the mean reflectivity is 18%.

For substrate C of FIG. 2 with structures in the form of pits 8 (RF power 100 W), the reflectivity curve 9 shows that the reflectivity is 29%.

A more interesting reduction in reflectivity was obtained with substrate D, exhibiting inverted pyramids 3, with a mean reflectivity of 6% (reflectivity curve 11).

The change of shape from normal pyramids to inverted pyramids is also observed by atomic force spectroscopy (AFM).

FIG. 4 shows images E and F and profiles E' and F' for textured silicon substrates, produced using AFM.

Image E is a three-dimensional view of normal pyramids 7, while image E' shows the profile of these structures. The width of the normal pyramids 7 is in the range 400 nm to 600 nm with a height in the range 100 nm to 150 nm.

Image F shows a three-dimensional image of inverted pyramids 3, while image F' shows the profile of certain of these structures.

The structures are composed of large inverted pyramids 3 and small inverted pyramids 4 formed inside a large pyramid 3. The width of the large inverted pyramids 3 is approximately 3 μm (between 1 μm and 5 μm). The width of the small pyramids 4 is in the range 200 nm to 1 μm. The depth of these structures is in the range 300 nm to 500 nm.

FIGS. 2 and 3 can explain the change in structure of the pyramids as a function of the RF power.

At low RF power (P=25 W), small white dots 6 form on the surface of the silicon substrate. These small white dots 6 are protected against plasma etching by micro-masks composed of $SiO_xF_y$ radicals, which are residues from etching with $SF_6/O_2$ plasma. However, the plasma is not strong enough to produce a more textured surface.

When the RF power is higher (P=50 W), the $SiO_xF_y$ micro-masks still protect the silicon placed underneath it (FIG. 2, substrate B). A small white dot 7' can be observed above each pyramid 7.

At a higher RF power, the pyramids are completely ablated, resulting in a near-flat silicon substrate surface. However, when the RF power is approximately 100 W, the surface does not remain flat for long, since it starts to be textured again, resulting in the appearance of pits 8 on the surface of the silicon substrate.

Finally, when the RF power reaches 150 W, the pit-shaped structures become deeper and wider, similar to inverted pyramids 3. Structures of various sizes are obtained.

The power of the radiofrequency plasma is preferably fixed during steps a) and a').

In accordance with one possible implementation, during steps a) and/or a'), the power of the radiofrequency plasma is progressively increased.

The method of the invention may be carried out in an apparatus comprising various chambers including an ion etching chamber in which the silicon substrate texturing in the gas phase of the invention is carried out, and at least one other chamber for plasma enhanced chemical vapor deposition (PECVD) in which one or more silicon deposition steps are carried out in order to obtain a solar cell.

Using a single apparatus means that contamination of the substrate during its transfer between the various reaction chambers can be avoided. This saves time and reduces the fabrication costs.

The surface of the substrates textured using the method of the invention then undergoes other treatments such as surface cleaning and passivation.

The method of the invention may be applied independently to one or to the two opposed faces of the silicon substrate.

Gas phase doped silicon deposition may be carried out on each of these faces to obtain a heterojunction of a solar cell.

The invention claimed is:

1. A method of texturing the surface of a silicon substrate in the gas phase, comprising at least one step a) for exposing said surface to low temperature $SF_6/O_2$ radiofrequency plasma in a reaction chamber for a period in the range 2 minutes to 30 minutes, to produce a silicon substrate having a textured surface exhibiting pyramidal structures, the $SF_6/O_2$ having a flow rate ratio in the range 2 to 10;
wherein:
during step a), plasma temperature is 200° C. or lower, the power density generated with the radiofrequency plasma is 2500 mW/cm$^2$ or more, and the pressure of $SF_6/O_2$ in the reaction chamber is 100 mTorr or less, so as to produce a silicon substrate with a textured surface having inverted type pyramidal structures.

2. The method of texturing the surface of a silicon substrate according to claim 1, further comprising, before step a), a step a') of exposing said surface to an oxygen radiofrequency low temperature plasma for a period of up to 8 minutes, the plasma temperature being 200° C. or lower.

3. The method of texturing the surface of a silicon substrate according to claim 2, wherein the duration of step a') is 5 minutes.

4. The method of texturing the surface of a silicon substrate according to claim 2, wherein during step a'), the power density generated with the radiofrequency plasma is in the range 500 mW/cm$^2$ to 4000 mW/cm$^2$, the pressure of oxygen in the reaction chamber being in the range 50 mTorr to 150 mTorr.

5. The method of texturing the surface of a silicon substrate according to claim 1, wherein the power density generated with the radiofrequency plasma is equal to 3000 mW/cm$^2$.

6. The method of texturing the surface of a silicon substrate according to claim 1, wherein during step a), the pressure of $SF_6/O_2$ in the reaction chamber is 100 mTorr, the $SF_6/O_2$ flow rate ratio is 3, and the plasma exposure period is 15 minutes.

7. The method of texturing the surface of a silicon substrate according to claim 2, wherein during steps a) and/or a'), the power of the radiofrequency plasma is progressively increased.

8. The method of texturing the surface of a silicon substrate according to claim 2, wherein steps a) and a') are carried out in a reactive ion etching apparatus.

9. A silicon substrate for a solar cell obtained by the method according to claim 1, and having a textured surface with inverted type pyramidal structures and a resistivity in the range 0.5 Ω.cm to 30 Ω.cm, wherein the width of the inverted pyramidal structures is in the range 200 nm to 3 μm, and the depth is in the range 200 nm to 1 μm.

10. The silicon substrate for a solar cell according to claim 9, wherein the textured surface of the silicon substrate has structures in the form of large inverted pyramids (3) and structures in the form of small inverted pyramids (4), the width of the structures in the form of large inverted pyramids (3) being in the range 1 μm to 5 μm and the width of the structures in the form of small inverted pyramids (4) being in the range 200 nm to 1 μm.

* * * * *